United States Patent [19]

Koze et al.

[11] Patent Number: 4,874,463

[45] Date of Patent: Oct. 17, 1989

[54] INTEGRATED CIRCUITS FROM WAFERS HAVING IMPROVED FLATNESS

[75] Inventors: Jeffrey T. Koze, Whitehall; Anton J. Miller, Lehigh County, both of Pa.

[73] Assignee: AT&T Bell Laboratories, Murray Hill, N.Y.

[21] Appl. No.: 290,653

[22] Filed: Dec. 23, 1988

[51] Int. Cl.⁴ .................. H01L 21/306; B44C 1/22; C03C 15/00; C03C 25/06
[52] U.S. Cl. ..................... 156/645; 156/651; 156/653; 156/657; 156/659.1; 156/661.1; 156/662
[58] Field of Search ............... 252/79.5; 156/636, 645, 156/651, 653, 657, 659.1, 661.1, 662, 649

[56] References Cited

U.S. PATENT DOCUMENTS

| | | | |
|---|---|---|---|
| 4,251,300 | 2/1981 | Caldwell | 156/662 X |
| 4,278,987 | 7/1981 | Imaizumi et al. | 156/647 X |
| 4,331,546 | 1/1982 | Abe et al. | 156/645 X |
| 4,671,851 | 6/1987 | Beyer et al. | 156/645 |
| 4,735,679 | 4/1988 | Lasky | 156/645 X |

*Primary Examiner*—William A. Powell
*Attorney, Agent, or Firm*—James H. Fox

[57] ABSTRACT

An improvement in silicon wafer flatness is obtained by reducing the time spent in polishing the wafer. After a conventional lapping operation, the wafer is coated with an etch resistant coating, typically silicon nitride. A polishing step removes the nitride coating on the flat surfaces of the wafer, but leaves a nitride coating on the sides of pits that are formed in the lapping operation. The wafer is then etched, typically in KOH, to remove the silicon surface to below the depth of the pits. The undercutting of the nitride coating removes the pits, or leaves relatively small protrusions in their place. The protrusions may be removed by a short polishing operation. Other wafer types and etch-resistant materials are possible. Integrated circuits are typically formed on the wafers by lithography techniques that advantageously utilize the improved flatness.

17 Claims, 1 Drawing Sheet

INTEGRATED CIRCUITS FROM WAFERS HAVING IMPROVED FLATNESS

BACKGROUND OF THE INVENTION

1. Field of the Invention

The present invention relates to a method of making integrated circuits from wafers having improved flatness.

2. Description of the Prior Art

Integrated circuits are fabricated from semiconductor wafers according to various techniques known in the art. However, one universal operation is one or more lithography steps that define circuit features on the wafer. In a typical lithographic operation, optical radiation is projected through a "mask" that contains the desired features onto a resist coated surface of the wafer. It is imperative that the feature be defined with minimum distortion, which can be caused by various optical aberrations, including an out-of-focus condition. At the current state of the art, silicon semiconductor wafers are about 125 to 150 millimeters (5 to 6 inches) in diameter, and gallium arsenide wafers are perhaps 50 to 100 millimeters (2 to 4 inches) in diameter. In contrast, the features to be optically reproduced on each integrated circuit typically have dimensions as small as 1 micrometer or less. The limiting factors in the ability to reproduce such small features uniformly over all sites on a relatively large wafer include the flatness and parallelism of the wafer surfaces. These are limitations because the lithographic equipment necessarily has a depth of focus that is on the order of the smallest lithographic feature. Even automatic refocusing, often used for lithographic "steppers" that produce multiple images on the sites across the surface of the wafer, does not compensate for variations within a given exposure field. Therefore, specifications for wafer flatness and parallelism are becoming increasingly more stringent, and typically require a back side referenced site flatness of 0.6 micrometers or less, for example.

However, the ability to produce flat wafers is limited by the various shaping and surface refining operations required to produce the wafers. That is, in a typical sequence of operations for a silicon wafer, the wafer is first cut, as with a diamond saw, from a cylindrical ingot that may be grown by techniques known in the art. The wafer is then typically lapped in a $Al_2O_3$ slurry to remove saw damage and obtain flatness. It is then etched in a solution of potassium hydroxide (KOH) to remove surface damage and debris caused by the lapping operation. At this point, both the front and back surfaces of the wafer are relatively flat, but have gouges and pits caused by the lapping and etching operations. That is, the lapping operation tends to form microscopic gouges in the surface, which are deepened and widened by the etching operation. The front side of the wafer is then polished, in order to remove the pits. The polishing is typically accomplished by mounting the wafer on a backing pad and rubbing the front surface against a soft polymer pad while flowing a colloidal silica slurry thereon. However, this polishing operation actually reduces surface flatness, mainly due to slight pressure variations across the wafer, and variations in the flow of the silica slurry. Hence, the front (i.e, polished) surface of the wafer becomes slightly uneven in terms of flatness and parallelism. It is therefore desirable to obtain wafers of the required smoothness and improved flatness and parallelism.

SUMMARY OF THE INVENTION

We have invented an improved method of shaping a wafer used to fabricate integrated circuits. A wafer is coated with an etch resistant material; for example, silicon nitride in the case of a silicon wafer. The coating is removed from the high-lying surface of the wafer, leaving an etch resistant coating on the sidewalls of low-lying portions (e.g., depressions, such as pits) of the wafer. An isotropic etching operation, typically wet etching in KOH, removes material from the non-coated surfaces of the wafer, thereby undercutting the etch resistant coating on the sidewalls of the pits. Optionally, a polishing operation may be used to remove small protrusions left after the etching operation.

For purposes of clarity, the feature sizes are not drawn to scale.

DETAILED DESCRIPTION

Figure 1:
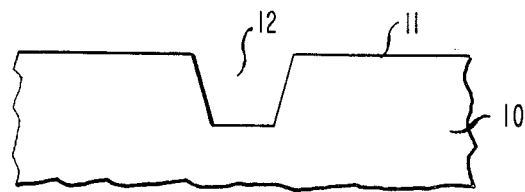
FIG. 1 shows a wafer having a pit in its surface.

The following detailed description relates to an improved method of preparing wafers for integrated circuit manufacture. Referring to FIG. 1, a semiconductor wafer 10 has located in the surface 11 a depression, such as pit 12. The surface 11 is usually referred to as the "top" or "front" surface, being the one in which active devices (transistors, optical devices, etc.) are formed. The pit most frequently results from abrasions caused by the above noted lapping operation, but could be from other sources as well, and are typically distributed over the entire surface of the wafer.

Figure 2:
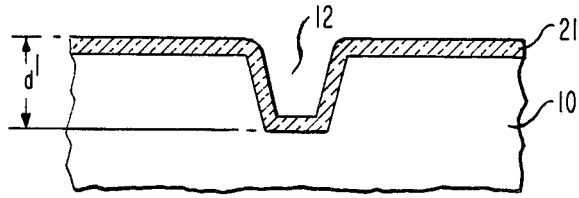
FIG. 2 shows the wafer after the deposition of an etch resistant coating.

Referring to FIG. 2, an etch resistant coating 21 is shown formed on the surface of the wafer. The term "etch resistant" refers to having a relatively slow rate of removal as compared to the material of the wafer 10 when subjected to the subsequent isotropic etching operation discussed below. For this purpose, coating 21 typically comprises silicon nitride when wafer 10 is silicon, with other materials being possible. The formation of the silicon nitride may be by a number of techniques known in the art. One suitable technique is to heat the wafer in a furnace containing a nitrogen ambient. For example, flowing $NH_3$ at a rate of 300 cubic centimeters per minute and $SiH_2Cl_2$ at a rate of 30 cubic centimeters per minute into a furnace at 775 degrees C. results in a silicon nitride deposition rate of about 2.9 nanometers per minute at a pressure of 290 millitorr. A deposition time of 17 minutes produces a silicon nitride thickness of 50 nanometers. In general, we estimate that silicon nitride thicknesses in the range of 10 to 100 nanometers are suitable for practicing the present invention. It is also possible to include other materials in coating 21. For example, silicon dioxide may be initially formed on the surface 11, followed by the silicon nitride.

The silicon nitride may also be formed on the back side of the wafer in preparation for a subsequent epitaxial deposition of semiconductor material on the front side. The silicon nitride then serves as a "cap" on the back side to prevent autodoping of the front side by dopants outdiffusing from the back side of the wafer. One convenient method for forming a silicon dioxide/silicon nitride cap is shown in U.S. Pat. No. 4,687,682 co-assigned with the present invention, with other techniques being possible. Note that in the prior art formation of a nitride cap, two wafers are loaded in a wafer boat front-to-front (i.e., so that the front sides are in contact), thereby allowing nitride deposition only on the exposed back sides. In contrast, in the present technique the wafers may be loaded individually into the boat, allowing furnace deposition on both sides. Alternately, if the epitaxial deposition is not to be preformed, the wafers may either be loaded back-to-back, so that the silicon nitride is deposited only on the front sides, or both sides may be coated, with the coating stripped off from the backside after polishing.

Figure 3:
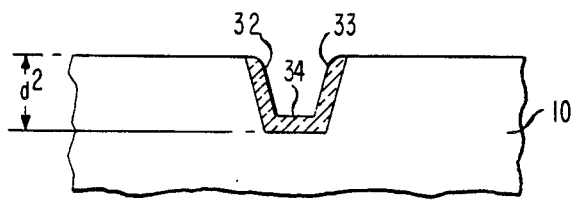
FIG. 3 shows the wafer after removing the etch resistant coating from the high-lying horizontal portions of the surface.

Referring to FIG. 3, a removal operation removes the etch resistant coating from the high-lying horizontal surface of the wafer, leaving portions 32, 33 on the sidewall of the pit, and portion 34 at the bottom of the pit. This removal operation may be performed using a conventional polishing technique in a presently preferred embodiment. In the illustrative embodiment, mechanical polishing with a colloidal silica slurry at a pH of 8.5 for about 1 to 5 minutes is suitable to remove silicon nitride approximately 50 nanometers thick from the high-lying surfaces. In addition, using polishing to accomplish the removal operation also removes a small thickness of the wafer material, typically about 10 percent of the depth of the coated pits $d^1$ shown in FIG. 2. This has the desirable effect of removing the smaller surface variations (i.e., peaks and valleys) on the wafer. Alternately, the removal may be accomplished by diamond lapping, according to principles known in the art. Still other removal techniques are possible.

Figure 4:
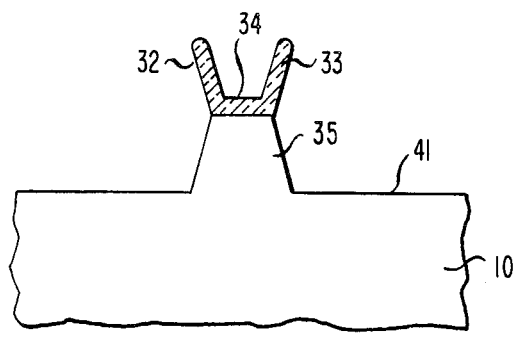
FIG. 4 shows the etch resistant coating after isotropic removal of the surface to beyond the depth of the pit.

Subsequent to the removal of the etch resistant coating, an isotropic etching process is used to remove the surface 11 down to a depth $d^2$ approximating the depth of the pit. In a typical case, $d^2$ lies in the range of 5 to 20 micrometers. In the illustrative embodiment, etching in KOH at a temperature of 90 degrees centigrade for about 10 to 20 minutes removes a silicon layer having a thickness in the range of 10 to 20 micrometers. As shown in FIG. 4, the isotropic etching undercuts the protective coating on the sidewalls, so that only regions 32, 33 and 34 remain as viewed in cross-section. Note that the shape of the remaining protective coating is determined by the shape of the pit. The basic shape of the pit is influenced by the crystallographic orientation of the wafer. In many cases, the pit is square or rectangular, so that the regions 32–34 are shaped accordingly. The remaining portions of the protective coating become more or less unsupported during etching as wafer material about a pit is removed. It is then possible to readily remove the regions 32–34 by a simple polishing operation.

Figure 5:
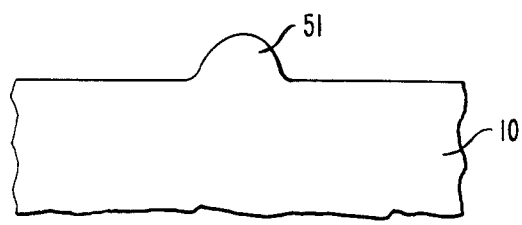
FIG. 5 shows a protrusion on the surface of the wafer resulting from etching beyond the depth of the pit.

It is apparent from FIG. 4 that if the isotropic etching proceeds beyond the deph of the pit, then the region under the protective coating will see less etching. That is, the region 35 will be protected by the coating 34 from the etchant. Therefore, a protrusion of wafer material, as shown by 51 in FIG. 5, will remain after the protective coating is removed. This protrusion may be removed by a subsequent polishing operation. In this subsequent polishing operation, it is predominantly silicon that has to be removed, as compared to predominantly silicon nitride in the initial polishing operation. As is well known in the art, a high pH increases chemomechanical action for silicon, and hence provides a faster removal rate and smoother surface. Therefore, a colloidal silica slurry with a pH value in the range of 9.5 to 11.5 is suitable for this subsequent polishing operation. For example, polishing with a slurry at a pH of 10 for about 8 to 10 minutes removes a thickness of about 7 micrometers of silicon. It may also be beneficial to polish for a short period of time (e.g., 1 to 2 minutes) with a lower pH value (e.g., 8 to 9), and then to synchronously switch to the higher pH value (e.g., 11). Such a short time at the lower pH helps assure a quicker removal of the remaining region 32–34 of the protective coating left behind by the isotropic etching. Note that this subsequent polishing operation may still be much shorter than prior art polishing operations, since a protrusion of a given height may be more readily removed than pits of a comparable depth. In practice, some protrusions are likely to be present if the etching proceeds to the depth of the deepest pit, since the depths of pits on a wafer varies over a range.

To determine the effectiveness of the present technique, the variations in thickness of a silicon wafer 125 millimeters in diameter were measured to give an indication of flatness. After the prior art lapping step, but prior to polishing, the variations were about 1 micrometer, according to the "TTV" measurement. After a conventional prior art polishing operation, the variations increased up to about 8 micrometers. In contrast, using the present inventive technique allowed the polishing time to be reduced suffciently so that the thickness variations were up to only 2 micrometers.

The exemplary values above are for an aluminum oxide abrasive slurry having a nominal grain size of 12 micrometers. However, the present invention may be practiced with other abrasives and grain sizes, with the appropriate changes to the values given. The present invention may also be practiced on surfaces obtained from mechanical preparation techniques other than lapping. For example, instead of being lapped on both sides, the wafer may be ground (e.g., on a bonded diamond wheel) or sawed on both sides. Alternately, the wafer may be lapped on one side and ground or sawed on the other, or ground on one side and sawed on the other. In any of these cases, the mechanical preparation may optionally be followed by chemical etching, as discussed above. The present invention is also applicable to wafers to be polished on both sides. In that case, both sides may be coated with an etch-resistant material, and both sides may be polished and etched as described above. The inventive treatment of the two sides may be practiced either simultaneously or sequentially.

Various other materials and processes are possible for practicing the present invention. For example, silicon dioxide may be used as the etch resistant material. Polymer coatings (e.g., lithographic resists) may also be used for this purpose, although their use may be limited by the temperature of the subsequent KOH etching operation. Other isotropic etchants, for example a solution of sodium hydroxide, may be used to remove silicon in the step shown in FIG. 4. Germanium and III–V semiconductor wafers may advantageously utilize the present technique with appropiate choice of etch resistant material and wafer etching techniques. Similarly, quartz (i.e., single crystal or fused silica) and glass wafers may utilize the present technique. In that case, aluminum oxide may be used as the etch resistant protective coating, and hydrofluoric acid (HF), or other fluoride-containing solutions, as the isotropic etchant. In general, the present technique may be practiced with a wafer of any brittle material. Finally, although sawing with a diamond tipped blade is the presently preferred technique for separating a wafer from an ingot, other techniques are possible, including, for example, the use of high pressure water jets, wire sawing, laser cutting, etc.

Following the operations of the present invention, integrated circuits are typically formed on the wafer using lithography techniques that advantageously utilize the improved flatness obtained thereby. Hence, the value of the present invention is not limited to the wafer production process per se, but rather extends to the intergrated circuit production process. The various lithography operations are well-known in the art, and need not be recited herein. Still other operations in the integrated circuit production process may benefit from the practice of the present invention, including deposition, etching, and planarization techniques.

CLAIMS:

1. A method of making integrated circuits formed on a given side of a wafer,
    characterized in that said wafer is prepared by steps comprising:
    (1) forming an etch resistant coating on said given side of said wafer having a surface with depressions;
    (2) removing said etch resistant coating from the surface of said given side while retaining the coating on the sidewalls of depressions in the surface;
    (3) isotropically etching said given side so as to remove a depth of material from said given side and to undercut at least a portion of said etch resistant coating on the sidewalls; and
    (4) removing the remaining portions of said etch resistant coating from the given side of said wafer,
    whereby a wafer having improved flatness is obtained.

2. The method of claim 1 wherein said etching continues beyond the depth of at least some depressions in the surface, so that protrusions remain after the removal of said etch resistant coating, and further comprising the step of removing said protrusions.

3. The method of claim 1 wherein said etching removes material to a depth of at least 10 micrometers from the given side of said wafer.

4. The method of claim 1 wherein said etch resistant coating comprises silicon nitride.

5. The method of claim 1 wherein said isotropically etching is accomplished with KOH.

6. The method of claim 1 wherein said removing said etch resistant coating is accomplished by polishing.

7. The method of claim 6 wherein said polishing is accomplished with the aid of a silica slurry.

8. The method of claim 1 wherein said removing the remaining portions of said etch resistant coating is accomplished by means of polishing.

9. The method of claim 8 wherein said polishing is accomplished with the aid of a silica slurry.

10. The method of claim 9 wherein said polishing is accomplished for an initial period with a silica slurry having a relatively low pH, and thereafter with a silica slurry having a relatively high pH.

11. The method of claim 1 wherein said wafer is obtained by sawing from a cylindrical ingot.

12. The method of claim 1 wherein said wafer is lapped by means of an abrasive, wherein said depressions are formed on the given side of said wafer.

13. The method of claim 1 further comprising the step of performing at least one lithography operation on said wafer, whereby features of said integrated circuit are defined.

14. The method of claim 1 comprising the additional steps of
    (1) forming an etch resistant coating on the side of said wafer opposite to said given side;
    (2) removing said etch resistant coating from the surface of the opposite side while retaining the coating on the sidewalls of depressions in the surface;
    (3) isotropically etching the opposite side so as to remove a depth of material from the opposite side and to undercut at least a portion of said etch resistant coating on the sidewalls; and
    (4) removing the remaining portions of said etch resistant coating from the opposite side of said wafer.

15. The method of claim 14 wherein said steps and the corresponding additional steps are accomplished sequentially on the given and the opposite sides.

16. The method of claim 14 wherein at least some of said steps and the corresponding additional steps are accomplished simultaneously on the given and the opposite sides.

17. A method of making a semiconductor wafer by steps comprising separating said wafer from an ingot of semiconductor material,
    characterized by further steps comprising
    (1) forming an etch resistant coating on a given side of said wafer;
    (2) removing said etch resistant coating from the high-lying surface of said given side while retaining the coating on the sidewalls of depressions in the surface;
    (3) isotropically etching said given side so as to remove a depth of material from said wafer and to undercut at least a portion of said etch resistant coating on the sidewalls;
    (4) removing the remaining portions of said etch resistant coating from the surface of said given side; and
    (5) polishing said given side, whereby a wafer having improved flatness is obtained.

* * * * *